United States Patent
Qi et al.

(10) Patent No.: US 10,121,868 B1
(45) Date of Patent: Nov. 6, 2018

(54) METHODS OF FORMING EPI SEMICONDUCTOR MATERIAL ON A THINNED FIN IN THE SOURCE/DRAIN REGIONS OF A FINFET DEVICE

(71) Applicant: GLOBALFOUNDRIES Inc., Grand Cayman (KY)

(72) Inventors: Yi Qi, Niskayuna, NY (US); Jianwei Peng, Latham, NY (US); Hsien-Ching Lo, Clifton Park, NY (US); Kwan-Yong Lim, Niskayuna, NY (US); Hui Zhan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/585,865

(22) Filed: May 3, 2017

(51) Int. Cl.
  *H01L 29/66* (2006.01)
  *H01L 29/417* (2006.01)
  *H01L 29/78* (2006.01)

(52) U.S. Cl.
  CPC .. *H01L 29/41791* (2013.01); *H01L 29/66795* (2013.01); *H01L 29/785* (2013.01)

(58) Field of Classification Search
  None
  See application file for complete search history.

(56) References Cited

U.S. PATENT DOCUMENTS

| 9,123,744 | B1 | 9/2015 | Liao et al. |
| 9,159,630 | B1 | 10/2015 | Wei et al. |
| 2012/0138886 | A1 | 6/2012 | Kuhn et al. |
| 2016/0064387 | A1* | 3/2016 | Jeong ............... H01L 27/1104 257/401 |
| 2016/0099352 | A1 | 4/2016 | Lee et al. |
| 2017/0054003 | A1 | 2/2017 | Liao et al. |
| 2017/0069756 | A1* | 3/2017 | Chiang ............ H01L 29/7848 |
| 2017/0154958 | A1 | 6/2017 | Fung et al. |
| 2017/0186598 | A1 | 6/2017 | Goel et al. |

OTHER PUBLICATIONS

Notice of Allowance from related U.S. Appl. No. 15/585,800 dated Oct. 23, 2017.
Office Action from related U.S. Appl. No. 15/483,476 dated Mar. 9, 2018.

* cited by examiner

*Primary Examiner* — Alexander Ghyka
(74) *Attorney, Agent, or Firm* — Amerson Law Firm, PLLC (57) ABSTRACT

One illustrative method disclosed includes, among other things, forming a gate around an initial fin structure and above a layer of insulating material, and performing a fin trimming process on an exposed portion of the initial fin structure in the source/drain region so as to produce a reduced-size fin portion positioned above a surface of a layer of insulating material in the source/drain region of the device, wherein the the reduced-size fin portion has a second size that is less than the first size. In this example, the method also includes forming a conformal epi semiconductor material on the reduced-size fin portion and forming a conductive source/drain contact structure that is conductively coupled to and wrapped around the conformal epi semiconductor material.

20 Claims, 6 Drawing Sheets

METHODS OF FORMING EPI SEMICONDUCTOR MATERIAL ON A THINNED FIN IN THE SOURCE/DRAIN REGIONS OF A FINFET DEVICE

BACKGROUND OF THE INVENTION

1. Field of the Invention

The present disclosure generally relates to the fabrication of integrated circuits, and, more particularly, to methods of forming epi semiconductor material on a thinned fin in the source/drain regions of a FinFET device and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Figure 1A:
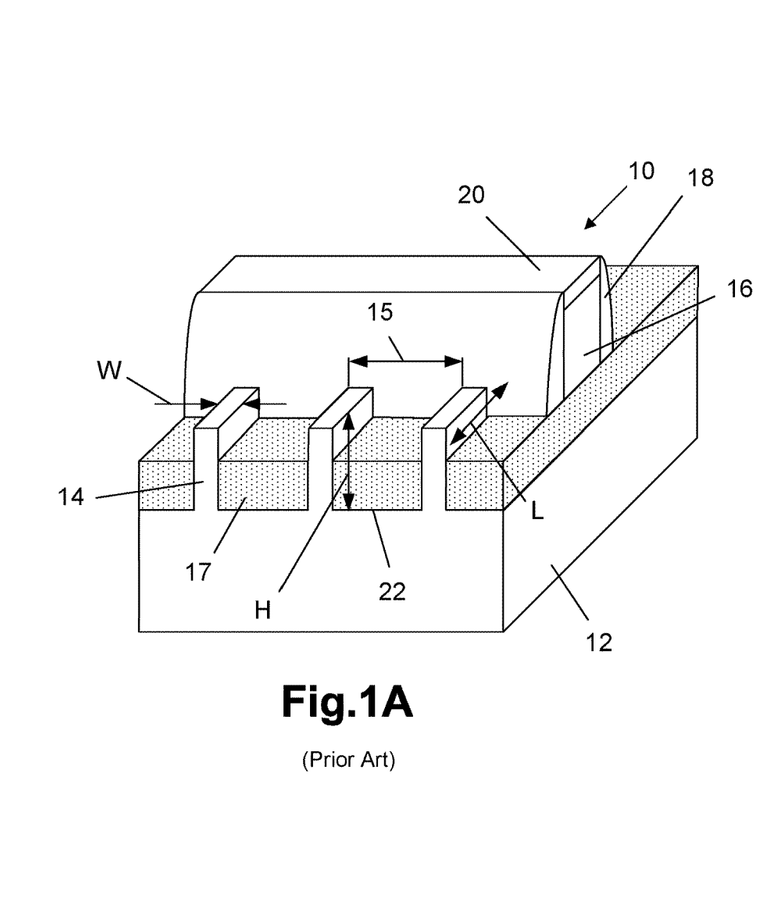
FIG. 1A is a simplistic depiction of an illustrative prior art FinFET device.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap 20. Fin-formation trenches 22 are formed in the substrate 12 to define the fins 14. A recessed layer of insulating material 17 is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length direction of the device. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As it relates to FinFET devices, advanced technology nodes require that the fins 14 be formed with an ever decreasing fin pitch 15 (see FIG. 1A).

Figure 1B:
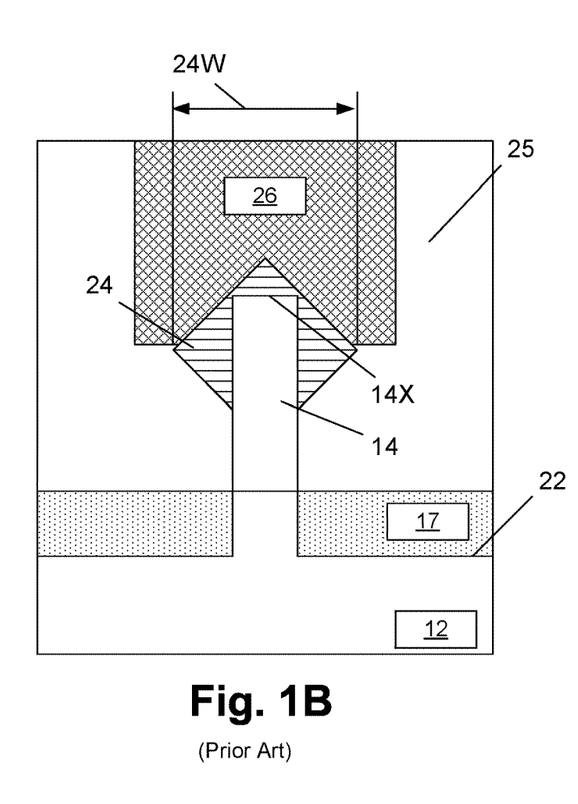
FIG. 1B is a simplistic depiction of illustrative diamond-shaped epi material that may be formed on a fin in the source/drain region of a FinFET device using prior art manufacturing techniques.

With reference to FIG. 1B, at some point during the process of manufacturing the device 10, epi semiconductor material 24 will be grown on the fins 14 in the source/drain regions of the device 10. Typically, due to the crystallographic orientation of the material of the fins 14, the epi material 24 will grow in a somewhat diamond-shaped or mushroom-shaped configuration. Ideally, the epi semiconductor material 24 on all of the fins 14 across the substrate 12 will be substantially uniform in volume and in size. However, the formation of the diamond-shaped epi material 24, with its relatively wide lateral width 24W, makes the formation of FinFET devices with ever decreasing fin pitches problematic. That is, due to the relatively large lateral width 24W of such diamond-shaped epi material, there is a greater chance of undesirable merger with epi material 24 on adjacent fins 14 as fin pitches are reduced. Such undesirable merger of the epi materials can result in electrical shorts and/or complete device failure and lead to reduced product yields. Moreover, the large lateral width 24W of the diamond-shaped epi material 24 makes area scaling difficult. For example, when forming such diamond-shaped epi material 24, the design rules regarding fin spacing (e.g., N-P fin spacing, P-P fin spacing) have to be large enough to accommodate the large lateral width 24W of the epi material 24.

While still referencing FIG. 1B, another problem encountered using prior art techniques relates to the formation of a conductive source/drain contact structure 26 in a layer of insulating material 25 so as to electrically contact the diamond-shaped epi material 24. Given the diamond-shaped configuration of the epi material 24, the conductive source/drain contact structure 26 typically only makes contact with the upper facing surfaces of the epi material 24, i.e., the conductive source/drain contact structure 26 is not positioned around all of the surfaces of the diamond-shaped epi material 24. As a result, the contact resistance of the device may be greater than desired.

The present disclosure is directed to various methods of forming epi semiconductor material on a thinned fin in the source/drain regions of a FinFET device and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming epi semiconductor material on a thinned fin in the source/drain regions of a FinFET device and the resulting device. One illustrative method disclosed includes, among other things, forming a gate around an initial fin structure and above a layer of insulating material, wherein the initial fin structure positioned in a source/drain region of the device comprises an exposed portion of the initial fin structure that is positioned above a level of an upper surface of the layer of insulating material, the exposed portion of the initial fin structure having a first size, and performing a fin trimming process on the exposed portion of the initial fin structure so as to produce a reduced-size fin portion positioned above the surface of the layer of insulating material in the source/drain region of the device, the reduced-size fin portion having a second size that is less than the first size. In this example, the method also includes forming a conformal epi semiconductor material on the reduced-size fin portion and forming a conductive source/drain contact structure that is conductively coupled to and wrapped around the conformal epi semiconductor material.

One illustrative FinFET device disclosed herein includes, among other things, a fin comprising a channel portion and a source/drain portion that extends into a source/drain region of the device and a gate positioned around the channel portion of the fin and above a layer of insulating material, wherein the source/drain portion of the fin comprises a first portion positioned below an upper surface of the layer of insulating material, the first portion having a first lateral width, in a gate width direction of the device, at a location that is level with an upper surface of the layer of insulating material, and a second portion positioned above the upper surface of the layer of insulating material having a second lateral width, in a gate width direction of the device, wherein the second lateral width is less than the first lateral width. In this example, the device further includes a conformal and substantially rectangular-shaped epi semiconductor material positioned on all surfaces of the second portion of the source/drain portion of the fin and a conductive source/drain contact structure that is conductively coupled to and is wrapped around the conformal and substantially rectangular-shaped epi semiconductor material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming epi semiconductor material on the source/drain region of a FinFET device and the resulting devices. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2E depict various methods disclosed herein for forming epi semiconductor material on a thinned fin in the source/drain regions of a FinFET device and the resulting device. In the example depicted herein, the FinFET device will be depicted as being comprised of a single fin 106. At the point of processing depicted in FIG. 2A, a plurality of illustrative gates 109A, 109B (collectively referenced by the numeral 109) have been formed above the fin 106 and the substrate 102. Each of the gates 109 includes a schematically depicted gate structure 110, a sidewall spacer 111 and a gate cap 112. Some of the figures contain a simplistic plan view showing where various cross-sectional views are taken in the drawings. The view X-X is a cross-sectional view taken through the fin 106 and the gates 109 (in a direction corresponding to the current transport (gate length) direction of the device). The view Y-Y is a cross-sectional view taken across the fin 106 through one of the source/drain regions of the device (in a direction corresponding to the gate width direction of the device). It should also be noted that, in some cases, the plan view may reflect at least some of the processing steps shown in the cross-sectional views, but no attempt has been made to reflect all of the processing steps shown in the cross-sectional views in the simplistic plan view so as to not overly complicate the drawings.

Figure 2A:
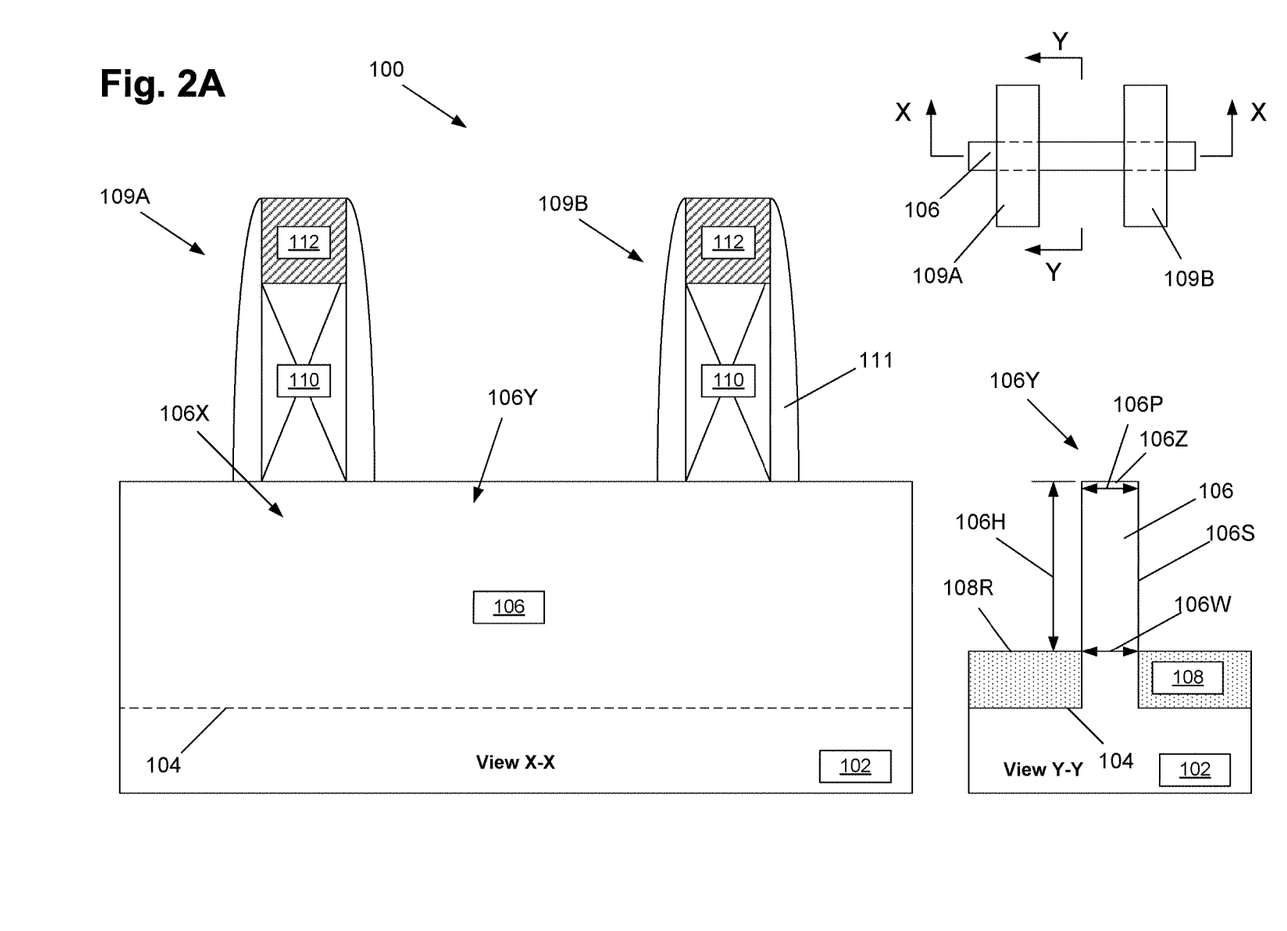
FIGS. 2A-2E depict various methods disclosed herein for forming epi semiconductor material on a thinned fin in the source/drain regions of a FinFET device and the resulting device.

With continuing reference to FIG. 2A, the illustrative device 100 will be formed in and above a semiconductor substrate 102. The device 100 may be either an NMOS transistor or a PMOS transistor. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration (not shown) that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. The gate structures 110 for the illustrative transistor devices disclosed herein may be formed using well-known "gate first" or "replacement gate" manufacturing techniques.

FIG. 2A depicts the device 100 after several process operations were performed. First, one or more etching processes, e.g., anisotropic etching processes, were performed through a patterned fin-formation etch mask (not shown) to form a plurality of fin-formation trenches 104 in the substrate 102 and thereby define a plurality of initial fin structures 106 across the substrate 102, one of which is shown in FIG. 2A. The patterned fin-formation hard mask may be comprised of one or more layers of material and it may be formed to any desired overall thickness, e.g., the patterned fin-formation hard mask may be comprised of a relatively thin layer of silicon dioxide and a relatively thicker layer of silicon nitride. The patterned fin-formation hard mask may be formed by depositing the layer or layers of material of the patterned fin-formation hard mask above the upper surface of the substrate 102 and thereafter patterning those layers of material using known photolithography and etching techniques.

With continuing reference to FIG. 2A, the lateral width (in the gate width direction) and the vertical height of the initial fin structures 106 may vary depending upon the particular application. Additionally, the overall size, shape and configuration of the fin-formation trenches 104 and initial fin structures 106 may vary depending on the particular application. In general, the initial fin structures 106 comprise opposing lateral sidewalls 106S and an upper surface 106Z.

The initial fin structures 106 have a lateral width 106W at a location that is approximately level with the recessed upper surface 108R of a recessed layer of insulating material 108 positioned in the trenches 104, and an exposed vertical height 106H above the recessed upper surface 108R of the recessed layer of insulating material 108.

In the illustrative examples depicted in the attached drawings, the fin-formation trenches 104 and the initial fin structures 106 are all depicted as having a uniform size and shape. However, such uniformity in the size and shape of the trenches 104 and the initial fin structures 106 is not required to practice at least some aspects of the inventions disclosed herein. In the attached figures, the fin-formation trenches 104 are depicted as having been formed by performing an anisotropic etching process that results in the initial fin structures 106 having a schematically (and simplistically) depicted, generally rectangular configuration. In an actual real-world device, the sidewalls 106S of the initial fin structures 106 may be somewhat outwardly tapered (i.e., the initial fin structures 106 may be wider at the bottom of the fin than they are at the top of the fin) although that configuration is not depicted in the attached drawings. Thus, the size and configuration of the trenches 104 and the initial fin structures 106, and the manner in which they are made, should not be considered a limitation of the present invention. For ease of disclosure, only the substantially rectangular trenches 104 and initial fin structures 106 will be depicted in the subsequent drawings. Moreover, the FinFET device may be formed with any desired number of fins 106. As noted above, in the example depicted herein, the FinFET device will be depicted as being comprised of one illustrative initial fin structure 106.

Still referencing FIG. 2A, after the initial fin structures 106 were formed, a layer of insulating material 108 (e.g., silicon dioxide) was then deposited so as to overfill the fin-formation trenches 104. Thereafter, at least one process operation, such as a chemical mechanical polishing (CMP) process, was performed to planarize the upper surface of the layer of insulating material 108 with the upper surface 106Z of the initial fin structures 106, thereby removing the patterned fin-formation hard mask. Next, a recess etching process was performed on the layer of insulating material 108 such that it has a recessed upper surface 108R that exposes the desired height 106H of the initial fin structures 106 above the recessed upper surface 108R.

Still with reference to FIG. 2A, after the layer of insulating material 108 was recessed, the simplistically depicted gate structures 110 with the gate cap 112 were formed above the initial fin structure 106. One of the gate structures 110 cover a portion of the initial fin structure 106 that will become the channel region of the device during operation. The gate structures 110 may be a final gate structure (a gate-first manufacturing process) or they may be sacrificial gate structure (for a replacement gate manufacturing process). One of the gates 109 may be an operational gate for the device while the other gate is a so-called dummy gate as it relates to the particular device. The gate structures 110 may be comprised of a gate insulation layer (not separately shown), e.g., silicon dioxide or a high-k material having a dielectric constant greater than 10, and a gate electrode comprised of one or more layers of conductive material (not separately shown), e.g., metal-containing materials. The gate caps 112 may be comprised of a material such as, for example, silicon nitride. As depicted, the fin 106 comprises a channel portion 106X (e.g., the portion of the fin 106 positioned under the gate 109A (for example)) and a source/drain portion 106Y that extends into what will become the source/drain region of the device, i.e., the portion of the fin 106 between the gates 109A, 109B in the depicted example. At the point of processing depicted in FIG. 2A, the channel portion 106X of the fin 106 positioned above the upper surface 108R of the layer of insulating material 108 and the source/drain portion 106Y of the fin 106 positioned above the upper surface 108R of the layer of insulating material 108 have the same basic overall size and configuration, which is reflected in the view Y-Y for the source/drain portion 106Y of the fin 106.

Figure 2B:
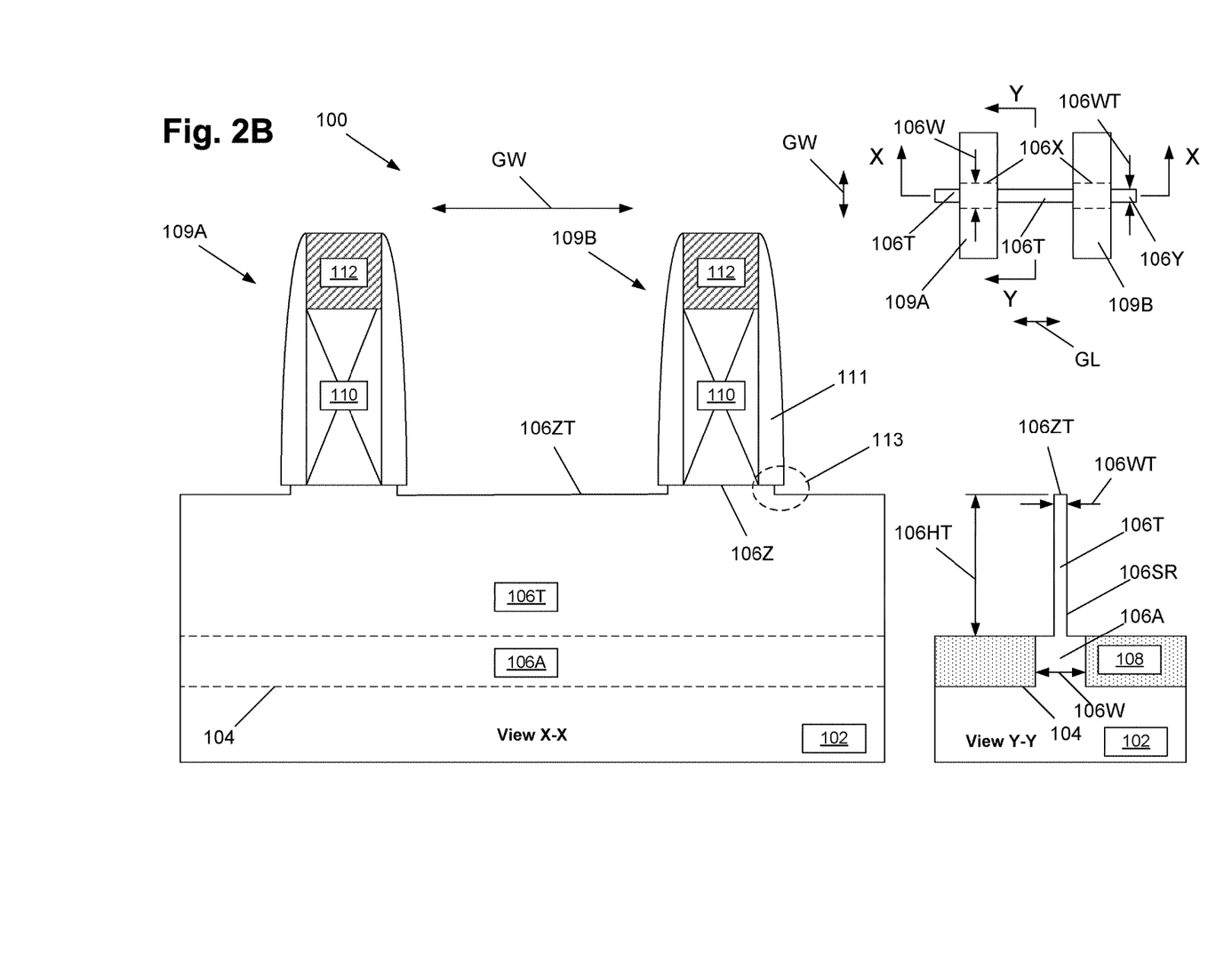

FIG. 2B depicts the device 100 after a fin-thinning process was performed on the exposed portions of the initial fin structure 106, i.e., on the source/drain portion 106Y of the fin 106. In one illustrative embodiment, the fin-thinning process may be a timed isotropic etching process or an oxidation and fin trimming process. This fin-thinning process results in a thinned-fin or reduced-size portion 106T of the source/drain portion 106Y of the initial fin structure 106 and a remaining portion 106A of the source/drain portion 106Y of the initial fin structure 106. In the example depicted in FIG. 2B, the thinned-fin or reduced-size portion 106T of the source/drain portion 106Y has an upper surface 106ZT and a thinned height 106HT that is less than the height 106H of the channel portion 106X of the initial fin structure 106. Similarly, the thinned-fin or reduced-size portion 106T of the source/drain portion 106Y of the fin 106 has a thinned width 106WT that is less than the width 106W of the channel portion 106X of the initial fin structure 106. The amount of thinning of the source/drain portion 106Y of the initial fin structure 106 may vary depending upon the particular application. In one illustrative example, the etching process is performed such that the thinned width 106WT of the thinned-fin portion 106T of the source/drain portion 106Y of the fin 106 is approximately 25-50% of the width 106W of the un-thinned channel portion 106X of the initial fin structure 106, wherein the width 106W is measured at the recessed surface 108R of the recessed layer of insulating material 108 and wherein the thinned width 106WT of thinned-fin portion 106T of the source/drain portion 106Y of the fin 106 is measured at a location that is slightly below the upper surface 106ZT of the thinned portion 106T of the source/drain portion 106Y. As best seen in the simplistic plan view, the channel portion 106X of the initial fin structure 106, with a lateral width 106W (in the gate width ("GW") direction of the device) remains substantially intact under the gate structures 110. However, as indicated only in the view X-X, the thinning of the source/drain portion 106Y of the initial fin structure 106 may result in some undercutting of the spacers 111 positioned adjacent the gate structures 110 of the gates 109, as indicated in the dashed-line region 113. If desired, after the source/drain portion 106Y of the initial fin structure 106 is thinned, various implantation processes may be performed to form various doped regions in the thinned portion 106T of the source/drain portion 106Y of the initial fin structure 106 as well as in the channel portion 106X of the initial fin structure 106.

As depicted, the channel portion 106X of the fin 106 has a first size (when viewed in a cross-section taken in the gate width direction), while the thinned portion 106T of the source/drain portion 106Y of the initial fin structure 106 has a second cross-sectional size (when viewed in a cross-section taken in the gate width direction) that is less than the first size of the channel portion 106X.

Just looking at the source/drain portion 106Y of the fin 106, the thinned portion 106T of the source/drain portion 106Y of the fin 106 has a first height 106HT above the upper surface 108R of the layer of insulating material 108 and a first lateral width 106WT (in the gate width direction) at a location adjacent the upper surface 106ZT of the thinned portion 106T of the source/drain portion 106Y, while the portion of the source/drain portion 106Y of the initial fin structure 106 positioned under the thinned portion 106T in the source/drain region of the device has a second lateral width 106W at a location adjacent the upper surface 108R of the layer of insulating material 108, wherein the second lateral width 106W is greater than the first lateral width 106ZT.

Additionally, the channel portion 106X of the initial fin structure 106 has a first height 106H above the upper surface 108R of the layer of insulating material 108 and a first lateral width 106P at a location that is approximately level with the upper surface 106Z of the channel portion 106X of the fin 106, while the thinned portion 106T of the source/drain portion 106Y of the initial fin structure 106 has a second height 106HT above the upper surface 108R of the layer of insulating material 108 and a second lateral width 106WT at a location adjacent the upper surface 106ZT of the thinned portion 106T of the source/drain portion 106Y of the initial fin structure 106, wherein the second height 106HT is less than the first height 106H and the second width 106WT is less than the first width 106W. Also note that the thinned portion 106T of the source/drain portion 106Y of the fin 106 is positioned adjacent the channel portion 106X of the initial fin structure 106 that is positioned under the gate 109 and that the upper surface 106ZT of the thinned portion 106T of the source/drain portion 106Y is at a level that is below a level of the upper surface 106Z of the channel portion 106X of the initial fin structure 106 positioned under the gate.

Figure 2C:
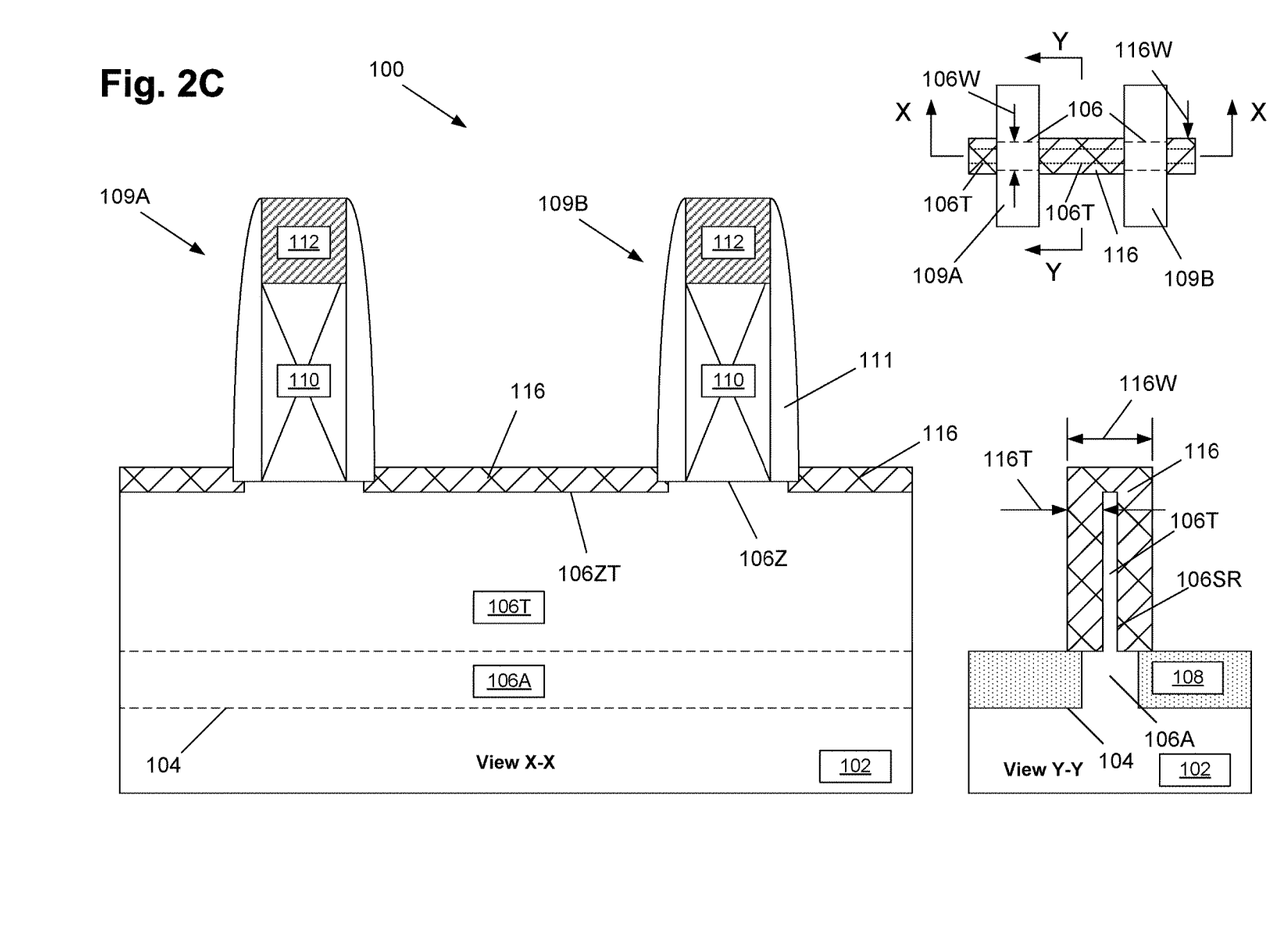

FIG. 2C depicts the device 100 after an epi deposition process was performed to form a substantially conformal and rectangular-shaped epi semiconductor material 116 on the exposed portions of the thinned portion 106T of the source/drain portion 106Y of the initial fin structure 106 in the source/drain regions of the device. The epi semiconductor material 116 has a lateral width 116W and it may be comprised of various different semiconductor materials depending upon the particular application. The epi semiconductor material 116 may be a different semiconductor material for N- and P-type devices. In one illustrative embodiment, for an N-type device, the epi semiconductor material 116 may be comprised of N-doped silicon, SiP, etc. In another illustrative example, for a P-type device, the epi semiconductor material 116 may be comprised of P-doped germanium (Ge), a P-doped silicon germanium ($Si_{(1-x)}Ge_x$), SiGe—B, etc. The epi semiconductor material 116 may be formed to any desired thickness 116T and it may be formed in a doped (in situ doping) condition (i.e., with the appropriate dopant material, e.g., an N-type dopant for an N-type device or a P-type dopant for a P-type device) or an undoped condition. In one illustrative example, the thickness 116T may be about 15-20 nm.

Of course, when it is stated that the epi semiconductor material 116 has a substantially rectangular-shaped configuration, geometric precision is not implied. That is, the epi semiconductor material 116 will generally grow to substantially conform to the shape of the thinned portion 106T of the initial fin structure 106. For example, if the initial fin structure 106 has a tapered configuration, i.e., the fin 106 being wider at the bottom of the fin than it is at the top of the fin, the thinned portion 106T of the source/drain portion 106Y of the initial fin structure 106 will substantially mirror the tapered shaped of the original fin 106 since the thinning of the fin 106 is performed by performing an isotropic etching process. In such a situation, the epi semiconductor material 116 will have a similar tapered configuration when it is formed on the tapered thinned portion 106T of the source/drain portion 106Y of the fin 106. In the drawings depicted herein, as noted earlier, the fins 106 have been depicted as being substantially rectangular in shape to simplify the drawings and the presentation herein. Thus, use of the phrase "substantially rectangular shaped" to describe the configuration of the epi semiconductor material 116 should be understood to accommodate and account for variations in the shape of the original fins 106, e.g., tapered, from the idealized rectangular shaped initial fin structure 106 depicted herein.

Importantly, the conformal and rectangular-shaped epi semiconductor material 116 formed has a relatively smaller lateral width 116W as compared to the relatively larger lateral width 24W of the generally diamond-shaped configuration of epi material 24 that is formed on prior art devices (see FIG. 1B). Accordingly, for FinFET devices formed in accordance with the methods disclosed herein, there is a lesser chance of undesirable epi merger, which should make the formation of FinFET devices with small fin pitches easier. As noted above, the conformal and rectangular-shaped epi semiconductor material 116 may be formed to any desired thickness 116T. This is beneficial in that at least some of the conformal and rectangular-shaped epi semiconductor material 116 will be consumed when a silicide material is formed in the source/drain regions. Accordingly, given the relative smaller lateral width of the epi material 116, if desired, the epi material 116 can be formed to have an extra thickness that will be consumed in the subsequent silicidation process. Absent such extra thickness, the silicidation process reduces the overall volume of epi material on the device, which may lead to undesirable high current crowding and an undesirable increase in resistance.

In one illustrative example, various forming gases may be used to form the conformal and rectangular-shaped epi semiconductor material 116. For example, in the case where the substrate 102 is a (100) silicon substrate, and wherein a long axis of the original fin 106 is oriented in a <110> crystallographic direction of the substrate, the conformal and rectangular-shaped epi semiconductor material 116 may be formed by performing an epitaxial deposition process using a combination of silane ($SiH_4$) (silicon source), dichlorosilane ($SiH_2Cl_2$) (silicon source), and germane ($GeH_4$) (germanium source) as precursor gases and hydrogen as a carrier gas, and a high pressure (>10 Torr, for example 300 Torr) to form a silicon germanium ($Si_{(1-x)}Ge_x$) conformal and rectangular-shaped epi semiconductor material 116 on the exposed surfaces of the thinned portion 106T of the initial fin structure 106, wherein the flow rate of dichlorosilane used during the epitaxial deposition process is equal to 10-90% of the combined flow rate of silane and dichlorosilane.

Figure 2D:
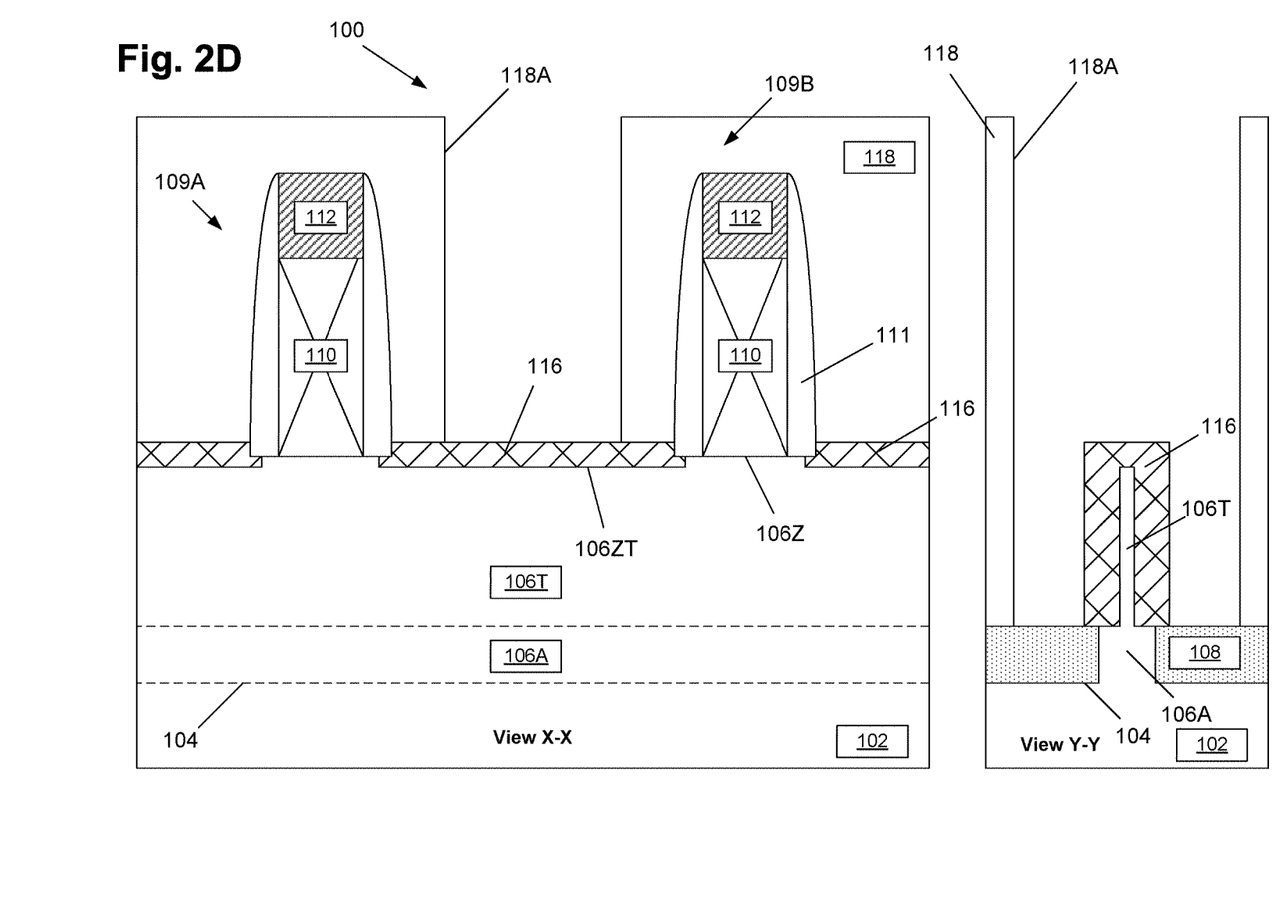

FIG. 2D only depicts the device 100 after several process operations were performed. First, a conformal contact etch stop layer (not shown), e.g., silicon nitride, was formed on the device 100. Thereafter, a layer of insulating material 118, e.g., silicon dioxide, was blanket-deposited across the substrate 102. Next, source/drain contact openings 118A were defined in the layer of insulating material 118 and the contact etch stop layer so as to expose portions of underlying source/drain regions and particularly the underlying epi semiconductor material 116.

Figure 2E:
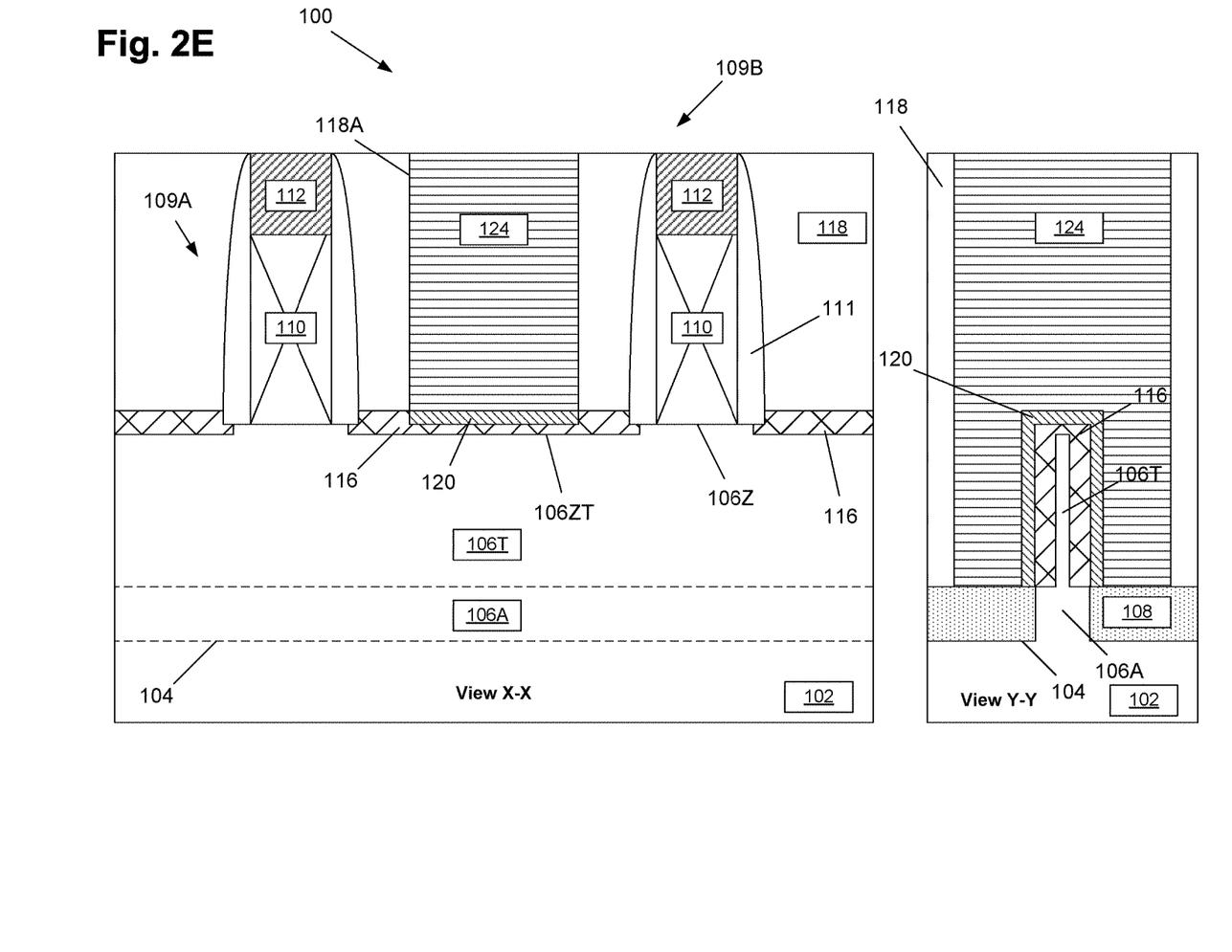

Thereafter, as shown in FIG. 2E, a conductive source/drain contact structure 124 that is conductively coupled to the epi material 116 was formed that wraps around the epi material 116 positioned above the insulating material 108.

The conductive source/drain contact structure 124 is intended to be representative in nature and may be formed using any of a variety of known techniques. In one illustrative example, the conductive source/drain contact structure 124 was formed by initially forming a traditional metal silicide region 120 through the source/drain contact openings 118A on the rectangular-shaped epi semiconductor material 116, followed by forming a conductive material, e.g., a metal-containing material such as tungsten (not separately shown), on the metal silicide region 120. Note that, in forming the trench silicide material 120, some of the epi material 116 is consumed. At that point, a chemical mechanical polishing (CMP) process was performed to remove excess conductive materials positioned outside of the source/drain contact openings 118A. As a result, using the method disclosed herein, FinFET devices may be manufactured using smaller fin pitches. Additionally, using the methods disclosed herein, the conductive source/drain contact structure 124 may be formed on all exposed surfaces of the epi material 116, i.e., the conductive source/drain contact structure 124 may be formed all around the epi material 116. As a result, the methods disclosed herein permit the formation of a substantially conformal and rectangular-shaped epi semiconductor material 116 having at least the same volume of epi material as compared to the prior art diamond-shaped epi material 24, while the lateral width 116W of the epi material 116 is less than the lateral width 24W of the prior art diamond-shaped epi material 24, thereby enabling the formation of devices with smaller fin pitches.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
    forming a gate around an initial fin structure and above a layer of insulating material, wherein said initial fin structure positioned in a source/drain region of said device comprises an exposed portion of said initial fin structure that is positioned above a level of an upper surface of said layer of insulating material, said exposed portion of said initial fin structure having a first size;
    performing a fin trimming process on said exposed portion of said initial fin structure so as to produce a reduced-size fin portion positioned above said upper surface of said layer of insulating material in said source/drain region of said device, said reduced-size fin portion having a second size that is less than said first size;

forming a conformal epi semiconductor material on an upper surface and sidewall surfaces of said reduced-size fin portion, wherein said sidewall surfaces extend in a direction parallel to an axial length of said reduced-size fin portion; and forming a conductive source/drain contact structure that is conductively coupled to and wrapped around said conformal epi semiconductor material.

2. The method of claim 1, wherein forming said conformal epi semiconductor material comprises forming a conformal and rectangular-shaped epi semiconductor material on said reduced-size fin portion.

3. The method of claim 1, wherein forming said conformal epi semiconductor material comprises forming said conformal epi semiconductor material on all surfaces of said reduced-size fin portion positioned above said upper surface of said layer of insulating material.

4. The method of claim 1, wherein forming said conformal epi semiconductor material comprises forming said conformal epi semiconductor material such that it encapsulates said reduced-size fin portion positioned above said upper surface of said layer of insulating material.

5. The method of claim 1, wherein, prior to performing said fin trimming process, said exposed portion of said initial fin structure in said source/drain region has a first height above said upper surface of said layer of insulating material and a first lateral width at a location that is approximately level with said upper surface of said layer of insulating material and wherein, after performing said fin trimming process, said reduced-size fin portion has a second height above said upper surface of said layer of insulating material and a second lateral width at a location adjacent an upper surface of said reduced-size fin portion, wherein said second height is less than said first height and said second width is less than said first width.

6. The method of claim 1, wherein forming said conductive source/drain contact structure comprises:
forming a conformal metal silicide region on all exposed surfaces of said conformal epi semiconductor material; and
forming a conductive material comprising a metal on said metal silicide region, all around said epi semiconductor material and above said layer of insulating material.

7. The method of claim 1, wherein, after performing said fin trimming process, said reduced-size fin portion is positioned adjacent a remaining portion of said initial fin structure positioned under said gate and wherein an upper surface of said reduced-size fin portion is at a level that is below a level of an upper surface of said remaining portion of said initial fin structure positioned under said gate.

8. The method of claim 7, wherein, after performing said fin trimming process, said reduced-size fin portion has a lateral width, in a gate-width direction of said device, at a location adjacent said upper surface of said reduced-size fin portion that is less than a lateral width, in said gate-width direction of said device, of said remaining portion of said initial fin structure positioned under said gate at a location adjacent an upper surface of said remaining portion of said initial fin structure positioned under said gate.

9. The method of claim 1, wherein said FinFET device is a P-type device and said initial fin structure comprises silicon and wherein forming said conformal epi semiconductor material comprises forming a conformal epi semiconductor material comprising silicon germanium ($Si_{(1-x)}Ge_x$) on said reduced-size fin portion.

10. The method of claim 1, wherein said FinFET device is an N-type device and said initial fin structure comprises silicon and wherein forming said conformal epi semiconductor material comprises forming a conformal epi semiconductor material comprising N-doped silicon on said reduced-size fin portion.

11. A method of forming a FinFET device, comprising:
forming a gate around an initial fin structure and above a layer of insulating material, wherein said initial fin structure positioned in a source/drain region of said device comprises an exposed portion of said initial fin structure that is positioned above a level of an upper surface of said layer of insulating material, said exposed portion of said initial fin structure in said source/drain region having a first height above said upper surface of said layer of insulating material and a first lateral width at a location that is approximately level with said upper surface of said layer of insulating material;

performing a fin trimming process on said exposed portion of said initial fin structure in said source/drain region of said device so as to produce a reduced-size fin portion positioned above said upper surface of said layer of insulating material, said reduced-size fin portion having a second height above said upper surface of said layer of insulating material and a second lateral width at a location adjacent an upper surface of said reduced-size fin portion, wherein said second height is less than said first height and said second width is less than said first width;

forming a conformal and rectangular-shaped epi semiconductor material on an upper surface and sidewall surfaces of said reduced-size fin portion positioned above said upper surface of said layer of insulating material, wherein said sidewall surfaces extend in a direction parallel to an axial length of said reduced-size fin portion; and forming a conductive source/drain contact structure that is conductively coupled to and is wrapped around said conformal and rectangular-shaped epi semiconductor material.

12. The method of claim 11, wherein forming said conformal and rectangular-shaped epi semiconductor material comprises forming said conformal and rectangular-shaped epi semiconductor material such that it encapsulates said reduced-size fin portion positioned above said upper surface of said layer of insulating material.

13. The method of claim 11, wherein forming said conductive source/drain contact structure comprises:
forming a conformal metal silicide region on all exposed surfaces of said conformal and rectangular-shaped epi semiconductor material; and
forming a conductive material comprising a metal on said metal silicide region, all around said conformal and rectangular-shaped epi semiconductor material and above said layer of insulating material.

14. The method of claim 11, wherein, after performing said fin trimming process, said reduced-size fin portion is positioned adjacent a remaining portion of said initial fin structure positioned under said gate and wherein an upper surface of said reduced-size fin portion is at a level that is below a level of an upper surface of said remaining portion of said initial fin structure positioned under said gate.

15. The method of claim 14, wherein, after performing said fin trimming process, said reduced-size fin portion has a lateral width, in a gate-width direction of said device, at a location adjacent said upper surface of said reduced-size fin portion that is less than a lateral width, in said gate-width direction of said device, of said remaining portion of said initial fin structure positioned under said gate at a location adjacent an upper surface of said remaining portion of said initial fin structure positioned under said gate.

16. A method of forming a FinFET device, comprising:
    forming a gate comprising a gate structure and a sidewall spacer positioned adjacent said gate structure around an initial fin structure and above a layer of insulating material, wherein said initial fin structure positioned in a source/drain region of said device comprises an exposed portion of said initial fin structure that is positioned above a level of an upper surface of said layer of insulating material and not covered by said gate, said exposed portion of said initial fin structure having a first size;
    performing a fin trimming process on said exposed portion of said initial fin structure after forming said sidewall spacer so as to produce a reduced-size fin portion positioned above said upper surface of said layer of insulating material in said source/drain region of said device, said reduced-size fin portion having a second size that is less than said first size;
    forming a conformal epi semiconductor material on an upper surface and sidewall surfaces of said reduced-size fin portion, wherein said sidewall surfaces extend in a direction parallel to an axial length of said reduced-size fin portion; and
    forming a conductive source/drain contact structure that is conductively coupled to and wrapped around said conformal epi semiconductor material.

17. The method of claim 16, wherein forming said conformal epi semiconductor material comprises forming a conformal and rectangular-shaped epi semiconductor material on said reduced-size fin portion.

18. The method of claim 16, wherein, prior to performing said fin trimming process, said exposed portion of said initial fin structure in said source/drain region has a first height above said upper surface of said layer of insulating material and a first lateral width at a location that is approximately level with said upper surface of said layer of insulating material and wherein, after performing said fin trimming process, said reduced-size fin portion has a second height above said upper surface of said layer of insulating material and a second lateral width at a location adjacent an upper surface of said reduced-size fin portion, wherein said second height is less than said first height and said second width is less than said first width.

19. The method of claim 16, wherein forming said conductive source/drain contact structure comprises:
    forming a conformal metal silicide region on all exposed surfaces of said conformal epi semiconductor material; and
    forming a conductive material comprising a metal on said metal silicide region, all around said epi semiconductor material and above said layer of insulating material.

20. The method of claim 16, wherein, after performing said fin trimming process, said reduced-size fin portion is positioned adjacent a remaining portion of said initial fin structure positioned under said gate and wherein an upper surface of said reduced-size fin portion is at a level that is below a level of an upper surface of said remaining portion of said initial fin structure positioned under said gate, and said reduced-size fin portion has a lateral width, in a gate-width direction of said device, at a location adjacent said upper surface of said reduced-size fin portion that is less than a lateral width, in said gate-width direction of said device, of said remaining portion of said initial fin structure positioned under said gate at a location adjacent an upper surface of said remaining portion of said initial fin structure positioned under said gate.

* * * * *